United States Patent
Srinivasan et al.

(10) Patent No.: US 9,691,751 B2
(45) Date of Patent: Jun. 27, 2017

(54) IN-SITU DOPED POLYSILICON FILLER FOR TRENCHES

(71) Applicant: Texas Instruments Incorporated, Dallas, TX (US)

(72) Inventors: Bhaskar Srinivasan, Allen, TX (US); Khanh Quang Le, Garland, TX (US); Collin White, Richardson, TX (US); Sopa Chevacharoenkul, Richardson, TX (US); Ashley Norris, Bells, TX (US); Bernard John Fischer, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/570,530

(22) Filed: Dec. 15, 2014

(65) Prior Publication Data
US 2016/0172235 A1    Jun. 16, 2016

(51) Int. Cl.
*H01L 27/02*  (2006.01)
*H01L 21/763* (2006.01)
*H01L 29/06*  (2006.01)

(52) U.S. Cl.
CPC ........ *H01L 27/0248* (2013.01); *H01L 21/763* (2013.01); *H01L 29/0649* (2013.01)

(58) Field of Classification Search
None
See application file for complete search history.

(56) References Cited

U.S. PATENT DOCUMENTS

| | | | | |
|---|---|---|---|---|
| 6,162,721 A * | 12/2000 | Tang | ................. | H01L 21/76885 257/E21.589 |
| 7,157,327 B2 | 1/2007 | Haupt | | |
| 2004/0235278 A1* | 11/2004 | Herner | ................. | C23C 16/045 438/488 |
| 2007/0128868 A1* | 6/2007 | Halahan | ............ | H01L 21/76843 438/687 |
| 2009/0253261 A1* | 10/2009 | MacNamara | ....... | B81C 1/00301 438/667 |
| 2011/0195565 A1* | 8/2011 | Mueller | ................ | H01L 21/743 438/586 |
| 2012/0289046 A1* | 11/2012 | Ko | .................... | H01L 21/32155 438/675 |

* cited by examiner

*Primary Examiner* — Asok K Sarkar
(74) *Attorney, Agent, or Firm* — Tuenlap D. Chan; Charles A. Brill; Frank D. Cimino

(57) ABSTRACT

A method of fabricating an integrated circuit (IC) includes etching a trench in a semiconductor substrate having an aspect ratio (AR) ≥5 and a trench depth ≥10 μm. A dielectric liner is formed along the walls of the trench to form a dielectric lined trench. In-situ doped polysilicon is deposited into the trench to form a dielectric lined polysilicon filled trench having a doped polysilicon filler therein. The doped polysilicon filler after completion of fabricating the IC is essentially polysilicon void-free and has a 25° C. sheet resistance ≤100 ohms/sq. The method can include etching an opening at a bottom of the dielectric liner before depositing the polysilicon to provide ohmic contact to the semiconductor substrate.

14 Claims, 4 Drawing Sheets

IN-SITU DOPED POLYSILICON FILLER FOR TRENCHES

FIELD

Disclosed embodiments relate to doped polysilicon filled trenches for integrated circuits (ICs).

BACKGROUND

Active devices on a chip are generally spaced apart by regions known as field regions in which the isolation structures are formed. An alternative to the LOCal Oxidation of Silicon (LOCOS) process for isolation is known as trench isolation. Some trench process involve doped polysilicon fillers, such as when an ohmic contact is needed to be made between the polysilicon filler and the semiconductor substrate.

In one trench arrangement having doped polysilicon fillers, a two-step implant polysilicon filling process is used. A trench is formed in the substrate, such as by reactive ion etching (RIE), the trench is lined by a dielectric liner (e.g., thermal silicon oxide), and the lined trench is then filled by a polysilicon filler. The polysilicon filler material can then be doped, generally by ion implantation followed by a thermal implant activation step.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize conventional two step deposition then ion implant to provide a doped polysilicon filler for trenches results in voids that can migrate within the trench during annealing causing reliability issues and higher substrate contact resistance for circuit arrangements where the trench includes a bottom aperture through the dielectric liner and the doped polysilicon contacts the semiconductor substrate. Moreover, since the polysilicon filler is conventionally deposited undoped, an extra implant step is needed for dopant incorporation.

Disclosed embodiments describe in-situ doped polysilicon for trench fill to form dielectric lined polysilicon filled trenches (polysilicon filled trenches) having doped polysilicon filler therein. The doped polysilicon filler in the final integrated circuit (IC) after wafer fabrication is completed is generally essentially polysilicon void-free. As used herein the term "polysilicon void" refers to an empty or cavity region within the polysilicon filler of a dielectric lined polysilicon filled trench that can be along the dielectric liner or within the polysilicon filler that has at least one dimension which is at least 0.3 μm long, typically being a v-shaped void (see voids in FIG. 3A described below). The term "essentially void-free" as used herein refers at least 90% of the plurality of dielectric lined polysilicon filled trenches on an IC being void-free throughout their volume determinable from cross-sectional scanning electron microscopy (X-SEM), where the polysilicon filled trenches have a depth of ≥10 μm and an aspect ratio ≥5.

BRIEF DESCRIPTION OF THE DRAWINGS

Reference will now be made to the accompanying drawings, which are not necessarily drawn to scale, wherein.

DETAILED DESCRIPTION

Figure 1:
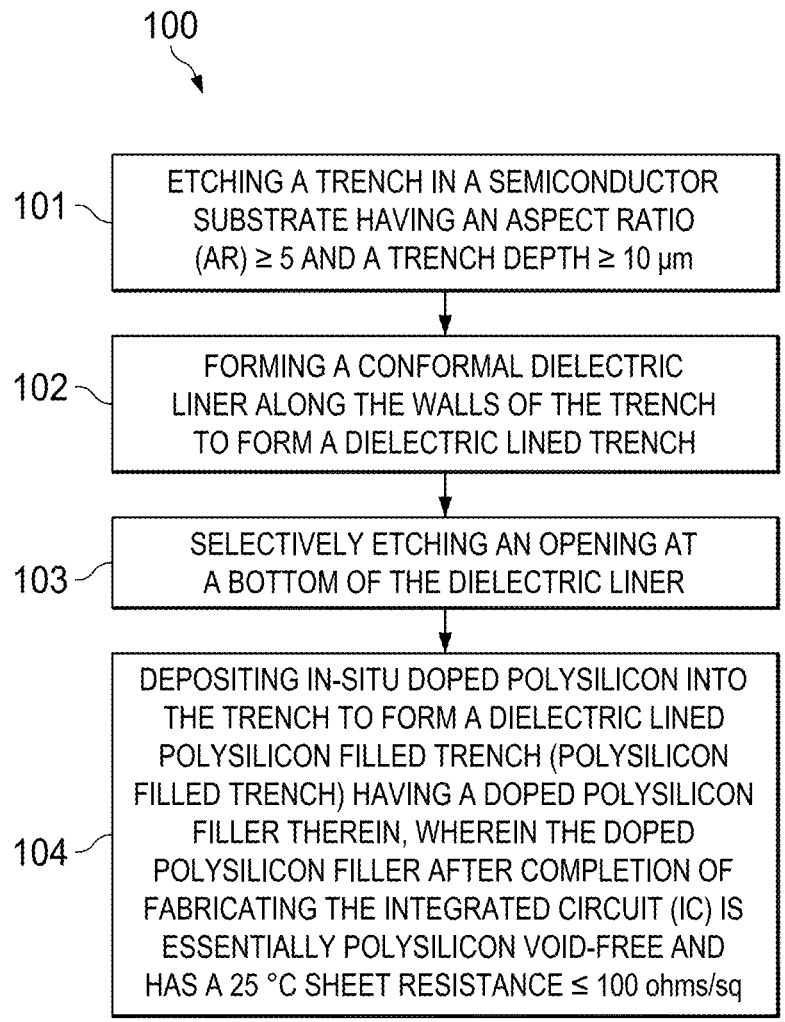
FIG. 1 is a flow chart that shows steps in an example method of fabricating an integrated circuit (IC) including forming in-situ doped polysilicon for trench filling of polysilicon filled trenches, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of fabricating an IC including in-situ doped polysilicon for trench filling to form polysilicon filled trenches, according to an example embodiment. Step 101 comprises etching a trench in a semiconductor substrate having an aspect ratio (AR) ≥5 and a trench depth ≥10 μm. The trench depth can be between 20 μm and 50 μm. In one particular embodiment, the trench opening dimension at the semiconductor surface can be from 2.35 μm to 2.85 μm and the trench depth is about 25 μm to 30 μm.

The semiconductor substrate can be a bulk semiconductor substrate or can comprise an epitaxial layer on a bulk substrate material. The semiconductor substrate and/or semiconductor surface can comprise silicon, silicon-germanium, or other semiconductor material such as gallium arsenide (GaAs), indium phosphide (InP) or silicon carbide (SiC). One particular arrangement is a silicon/germanium (SiGe) semiconductor surface on a silicon substrate. The etching generally comprises reactive ion etching (RIE).

Step 102 comprises forming a conformal dielectric liner along the walls of the trench to provide a dielectric lined trench. The forming can comprise a thermal or deposition process, or a combination of such processes. For example, in one particular embodiment the dielectric layer comprises silicon oxide and is formed using a thermal 2.5 kA silicon oxide layer process followed by a deposited sub-atmospheric CVD (SACVD) process to provide a silicon oxide layer about 5 kA thick.

For circuit arrangements where the trench needs a bottom aperture through the dielectric liner for the in-situ doped polysilicon to contact the semiconductor substrate, such as to enable the trench to ohmically contact the substrate from the topside (circuit side), method 100 can further comprise step 103 comprising selectively etching the dielectric liner to form an opening at a bottom of the dielectric liner before the in-situ doped polysilicon deposition (step 104) to provide an ohmic contact between the later deposited doped polysilicon filler and the semiconductor substrate. The semiconductor substrate can be boron doped and the polysilicon boron doped, or in another arrangement the semiconductor substrate can be n-typed doped and the polysilicon filler n-type doped.

Step 104 comprises depositing in-situ doped polysilicon into the dielectric lined trench to form a polysilicon filled trench having a doped polysilicon filler therein. The doped polysilicon filler after completion of fabricating the IC is essentially polysilicon void-free and has a 25° C. sheet resistance ≤100 ohms/sq.

The depositing can comprise a multi-step deposition including an initial undoped polysilicon portion, then a doped polysilicon portion, then a final undoped polysilicon portion that may be referred to as a capping layer. One specific example is undoped polysilicon about 3 kA thick then in-situ doped polysilicon about 1 kA thick, followed by undoped polysilicon capping layer about 14 kA thick. The doped polysilicon layer being sandwiched between undoped polysilicon layers helps avoid out diffusion of dopant into the dielectric liner material (e.g., silicon oxide) along the sidewalls of the trench. As the polysilicon is generally deposited on both sides of the wafer, the capping layer is may later be removed by Chemical Mechanical Planarization or Polishing (CMP) on the front surface of the wafer and by backside polysilicon strip on the wafer backside. Another embodiment comprises a continuous single step polysilicon deposition but with lower dopant concentration as compared to the doping level in the doped polysilicon layer in the sandwich arrangement described above.

The depositing can comprise Low Pressure Chemical Vapor Deposition (LPCVD) utilizing silane gas at a deposition temperature range of 550° C. to 650° C. and a pressure range from 100 mTorr to 400 mTorr. The temperature range is generally 555° C. to 625° C., and the pressure range is generally from 250 mTorr to 350 mTorr.

For boron doped polysilicon, the depositing can comprise flowing $BCl_3$ gas in a flow range from 5 to 30 sccm along with at least one diluent gas so that the $BCl_3$ gas is diluted to become ≤10% of the gas in the deposition chamber by volume. The diluent gas can comprise $H_2$. For example, it has been recognized that 100% $BCl_3$ generally results in attack of the dielectric liner material when it comprises silicon oxide. One specific deposition process uses 3% $BCl_3$ (balance 97% with $H_2$), and another process uses 0.5% $BCl_3$ (balance 99.5% $H_2$). The diluting gas can also be other gases, such as $N_2$ or Ar.

The method 100 can further comprise annealing the polysilicon filled trenches at a temperature between 900° C. and 1150° C. A furnace anneal at a temperature from 900° C. to 1100° C. for 10 to 65 minutes can be used, or a rapid thermal anneal (RTA) at a temperature between 900° C. to 1100° C. for about 30 to 60 seconds. After the annealing of the polysilicon filled trenches through the completion of fabricating the IC the doped polysilicon filler is essentially polysilicon void-free.

For the IC after completion of its fabrication process, the doped polysilicon filler generally has an average dopant concentration between $1 \times 10^{18}$ $cm^{-3}$ and $5 \times 10^{21}$ $cm^{-3}$, and a 25° C. sheet resistance of ≤50 ohms/sq. The polysilicon filled trenches can be trench isolation structures on the IC, or other trench structures including trench capacitors, field plates, or rings.

Figure 2A:
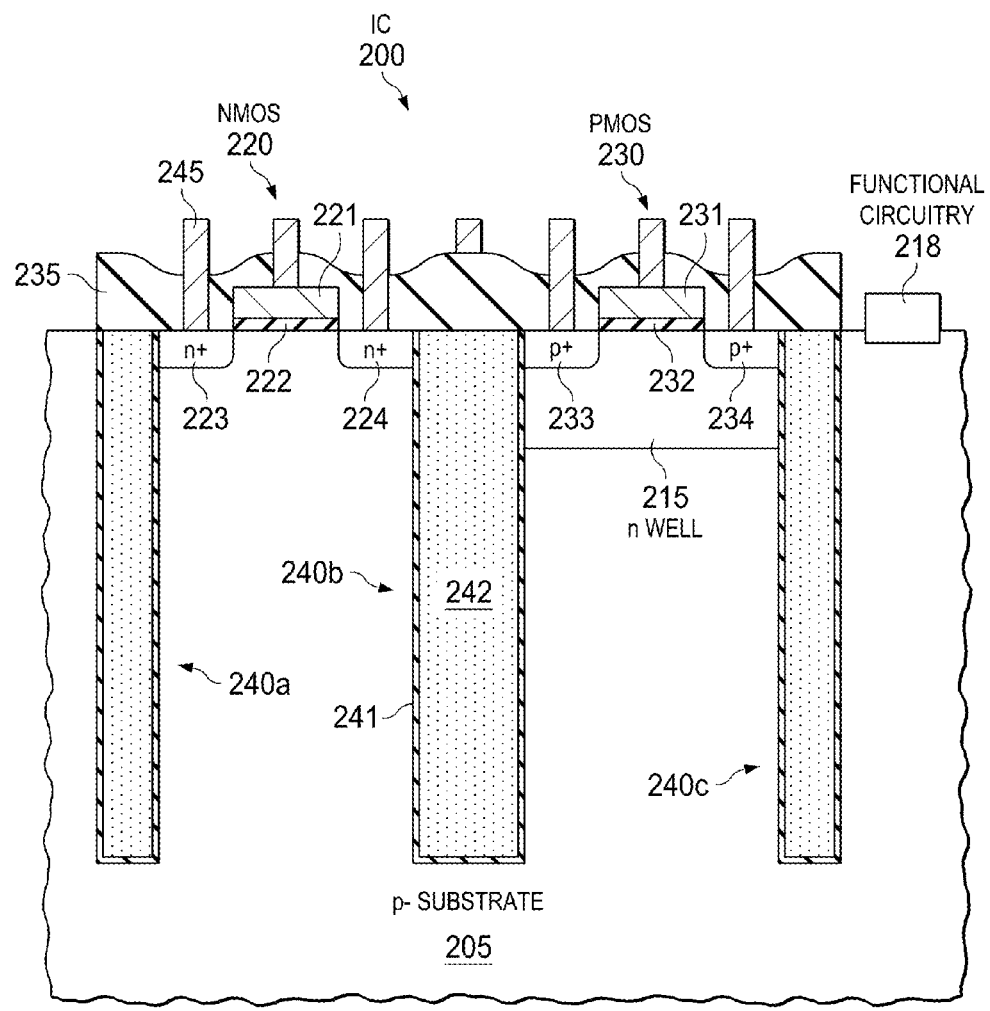
FIG. 2A is a schematic cross-sectional view of an example IC including disclosed polysilicon filled trenches, according to an example embodiment.

FIG. 2A is a schematic cross-sectional view of an example CMOS IC 200 including disclosed polysilicon filled trenches 240a, 240b and 240c, according to an example embodiment. The IC 200 includes a semiconductor substrate 205 shown as a p-substrate having functional circuitry shown as functional circuitry block 218 formed on and in the semiconductor substrate 205. An NMOS transistor 220 and a PMOS transistor 230 are shown that are generally also included in the functional circuitry block 218 along with other CMOS circuitry, as well as with bipolar transistors for BiCMOS circuits, and resistors and capacitors configured together to perform a circuit function. The PMOS transistor 230 is shown formed in an nwell 215.

NMOS transistor 220 includes a gate electrode 221 on a gate dielectric 222 along with drain 223 and source 224 formed in the semiconductor substrate 205. PMOS transistor 230 includes a gate electrode 231 on a gate dielectric 232 along with source 233 and drain 234 formed in the semiconductor substrate 205. Contact metal 245 is shown providing contacts through apertures in the pre-metal dielectric layer 235 shown.

The polysilicon filled trenches 240a, 240b and 240c in the semiconductor substrate 205 provide electrical isolation, such as between the NMOS transistor 220 and PMOS transistor 230 shown. The dielectric liner is shown as 241 and the doped polysilicon filler as 242. The 25° C. sheet resistance of the doped polysilicon filler 242 is ≤100 ohms/sq, and AR of the plurality of polysilicon filled trenches 240 shown as 240a, 240b and 240c is ≥5, while the trench depth ≥10 µm. The doped polysilicon filler 242 is essentially polysilicon void-free. As noted above, "essentially void-free" as used herein refers at least 90% of a plurality of dielectric lined polysilicon filled trenches on an IC being void-free through their volume determinable from cross-section images obtained using X-SEM, where the dielectric lined polysilicon filled trenches 240a, 240b and 240c have a depth of ≥10 µm and an AR ≥5.

Figure 2B:
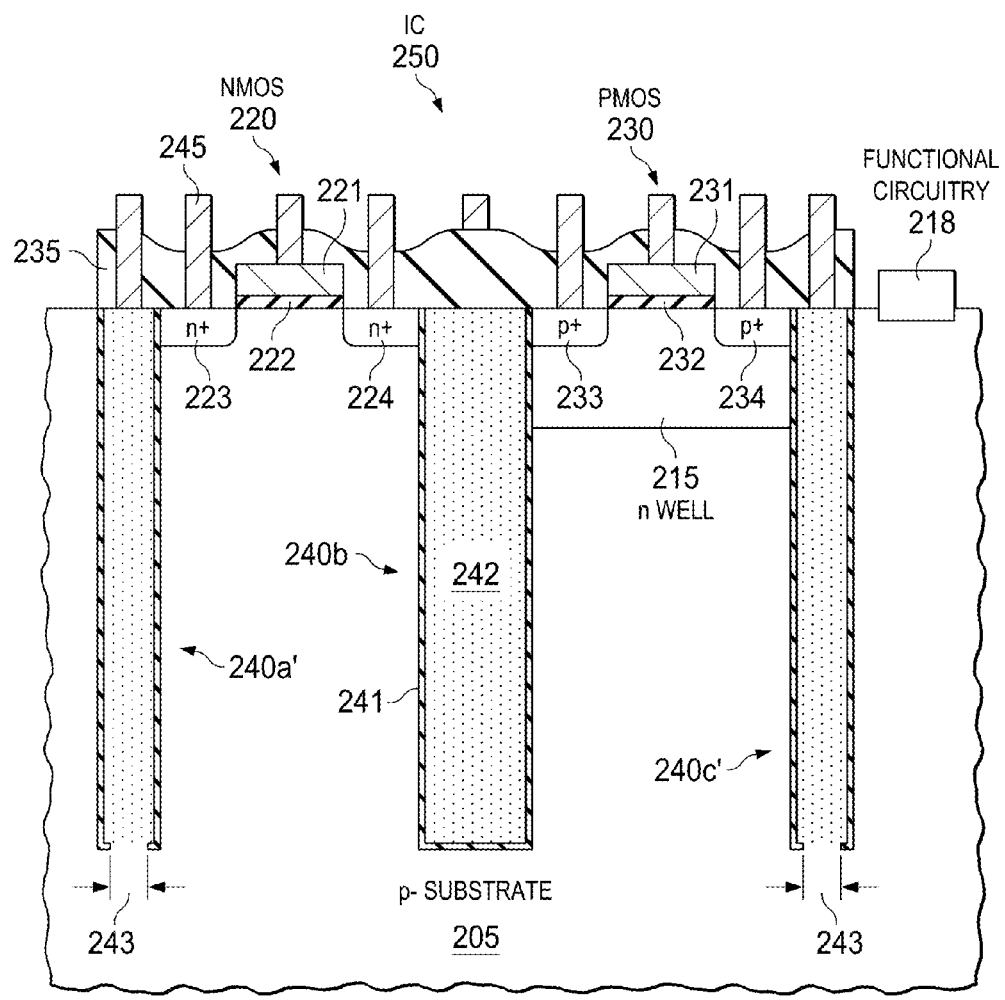
FIG. 2B is a schematic cross-sectional view of an example IC including disclosed polysilicon filled trenches having an opening at a bottom of the dielectric liner to provide an ohmic contact between the doped polysilicon filler in the trench and the semiconductor substrate, according to an example embodiment.

FIG. 2B is a schematic cross-sectional view of an example IC 250 including disclosed polysilicon filled trenches 240a' and 240c' each having an opening 243 at a bottom of the dielectric liner 241 that is otherwise conformal to provide an ohmic contact between the doped polysilicon filler 242 in the trench and the semiconductor substrate 205, according to an example embodiment. Contact metal 245 is shown contacting the doped polysilicon filler 242 in polysilicon filled trenches 240a' and 240c'. In this embodiment, the doped polysilicon filler 242 is boron doped to provide an ohmic contact to the semiconductor substrate as it is shown to be p-(boron) doped.

EXAMPLES

Disclosed embodiments are further illustrated by the following specific Examples, which should not be construed as limiting the scope or content of this Disclosure in any way.

Figure 3A:
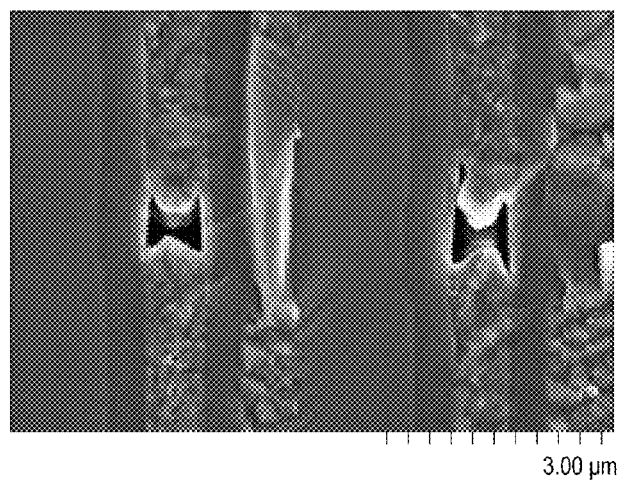
FIG. 3A is a scanned X-SEM image of a conventional polysilicon filled trenches having visible V-shaped voids, where the trenches were doped after polysilicon deposition by a boron ion implantation process and an dopant activation step.

FIG. 3A is a scanned X-SEM image of a conventional polysilicon filled trenches having visible V-shaped voids doped taken after polysilicon deposition followed by a known boron ion implantation process and then an implant activation step. Trenches were formed by reactive ion etching (RIE), lined by a thermally grown silicon oxide dielectric, and then a thin layer of undoped polysilicon (~2 kA) was deposited in the furnace first, and after the polysilicon deposition wafers were then processed on an ion implant tool to obtain an angled implant into the trenches. After the implant step was completed the wafers were taken back to the furnace to obtain thicker (~12 to 14 kA) undoped polysilicon to fill the trench completely. After the deposition/ implant/deposition process the wafers were annealed at high temperature to activate the dopants in the trench and to enable the dopants to diffuse so that they become distributed uniformly in the trench. For a process having a relative low DT following boron implantation of the polysilicon, as shown at least one 1 void tended to form in each trench particularly for relatively small trench widths (e.g., <3 μm) and deep trench depths (e.g., >20 μm).

Figure 3B:
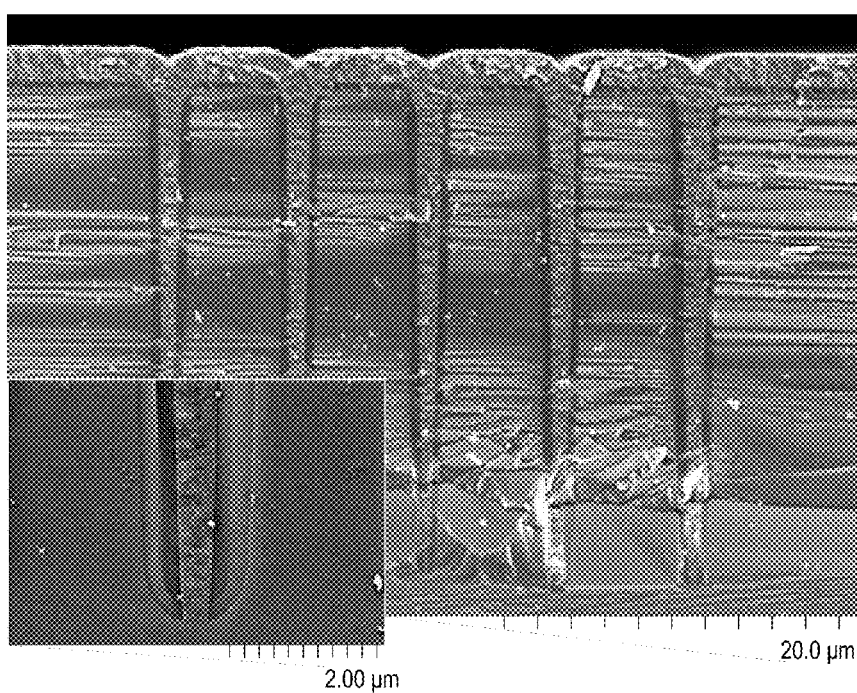
FIG. 3B is a scanned X-SEM image of a disclosed test structure having disclosed polysilicon filled trenches with varying trench opening/width that simulated product features with varying trench openings/widths were formed using a disclosed in situ boron doped polysilicon deposition process, where the doped polysilicon filler can be seen to be essentially polysilicon void-free, according to an example embodiment.

FIG. 3B is a scanned X-SEM image of a test structure having disclosed polysilicon filled trenches with varying trench opening/width size that simulated product features with varying trench openings/widths were formed using a disclosed in situ boron doped polysilicon deposition process, where the doped polysilicon filler is essentially polysilicon void-free, according to an example embodiment. Trenches were formed by RIE, lined by a thermally grown silicon oxide dielectric, and filled as described above, except instead of ion implanting the polysilicon the polysilicon was doped by a disclosed in situ boron polysilicon deposition. The X-SEM was taken after polysilicon deposition but before Chemical Mechanical Planarization (CMP). The trench opening was varied 2.45 μm to 2.85 μm and the trench depth was kept at 28 μm.

The different trench width (opening) shown in FIG. 3B has the opening size increasing from left to right. The dielectric liner is shown as being black in color due to X-SEM contrast with the dielectric being insulating and the polysilicon filler being electrically conducting. The horizontally oriented features in the silicon between the trenches is due to sample cleave from the SEM and should be ignored. Polysilicon is on the top of the whole test structure. The inset provided shows a nominal trench opening of 2.65 μm with complete polysilicon filling with no voids shown and the bottom of the liner silicon oxide optionally selectively etched to allow the boron doped polysilicon filler to make ohmic contact to the p-substrate.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating an integrated circuit (IC), comprising:

etching a trench in a semiconductor substrate, the trench having a trench depth between 10 μm and 50 μm;

forming a dielectric liner along walls of said trench to form a dielectric lined trench; and depositing in-situ doped polysilicon into said trench to form a dielectric lined polysilicon filled trench having a doped polysilicon filler.

2. The method of claim 1, wherein said doped polysilicon filler has an average dopant concentration between $5\times10^{18}$ $cm^{-3}$ and $1\times10^{21}$ $cm^{-3}$, and a 25° C. sheet resistance of ≤50 ohms/sq.

3. The method of claim 1, wherein said semiconductor substrate is a bulk substrate material.

4. The method of claim 1, further comprising etching an opening at a bottom portion of said dielectric liner before said depositing to provide an opening for an ohmic contact between said doped polysilicon filler and said semiconductor substrate.

5. The method of claim 1, wherein said semiconductor substrate is boron doped and said in-situ doped polysilicon is boron doped so that said doped polysilicon filler is boron doped.

6. The method of claim 1, wherein said depositing includes flowing $BCl_3$ gas in a flow range from 5 to 30 Standard Cubic Centimeters per Minute (sccm) along with at least one diluent gas so that said $BCl_3$ gas is diluted to less than 10% by volume.

7. The method of claim 6, wherein said diluent gas comprises $H_2$.

8. The method of claim 1, wherein for said depositing uses a temperature range of 550° C. to 650 C and a pressure range from 100 mTorr to 400 mTorr.

9. An integrated circuit (IC), comprising:
a semiconductor substrate; and
a plurality of dielectric lined polysilicon filled trenches in said semiconductor substrate each having a doped polysilicon filler essentially void-free, and each having a trench depth between 10 μm and 50 μm.

10. The IC of claim 9, wherein an average dopant concentration in said doped polysilicon filler is between $5\times10^{18}$ $cm^{-3}$ and $5\times10^{21}$ $cm^{-3}$, and a 25° C. sheet resistance of said doped polysilicon filler is equal to or less than 50 ohms/sq.

11. The IC of claim 9, wherein said semiconductor substrate is a bulk substrate material.

12. The IC of claim 9, wherein each of said plurality of dielectric lined polysilicon filled trenches includes a bottom opening providing an ohmic contact between said doped polysilicon filler and said semiconductor substrate.

13. The IC of claim 12, wherein said semiconductor substrate is boron doped, said doped polysilicon filler is boron doped, and a 25° C. sheet resistance of said doped polysilicon filler is less than or equal to 50 ohms/sq.

14. An integrated circuit (IC), comprising:
a semiconductor substrate; and
a plurality of dielectric lined polysilicon filled trenches in said semiconductor substrate each having:
a trench depth between 10 μm and 50 μm;
a doped polysilicon filler essentially void-free; and
a bottom opening providing an ohmic contact between said doped polysilicon filler and said semiconductor substrate.

* * * * *